US012787656B2

(12) United States Patent
Ye et al.

(10) Patent No.: US 12,787,656 B2
(45) Date of Patent: Nov. 3, 2026

(54) FIXED LAYER OF MAGNETIC TUNNEL JUNCTION, MAGNETIC MEMORY CHIP, AND METHOD FOR MANUFACTURING MAGNETIC TUNNEL JUNCTION

(71) Applicants: YANGTZE DELTA GRADUATE SCHOOL OF BBEIJING INSTITUTE OF TECHNOLOGY (JIAXING), Jiaxing (CN); BEIJING INSTITUTE OF TECHNOLOGY, Beijing (CN)

(72) Inventors: Shujun Ye, Beijing (CN); Koichi Nishioka, Jiaxing (CN)

(73) Assignees: YANGTZE DELTA GRADUATE SCHOOL OF BEIJING INSTITUTE OF TECHNOLOGY (JIAXING), Jiaxing (CN); BEIJING INSTITUTE OF TECHNOLOGY, Beijing (CN)

( * ) Notice: Subject to any disclaimer, the term of this patent is extended or adjusted under 35 U.S.C. 154(b) by 119 days.

(21) Appl. No.: 18/952,971

(22) Filed: Nov. 19, 2024

(65) Prior Publication Data

US 2026/0090278 A1 Mar. 26, 2026

Related U.S. Application Data

(63) Continuation of application No. PCT/CN2024/120034, filed on Sep. 20, 2024.

(51) Int. Cl.

*G11C 11/00* (2006.01)
*G11C 11/16* (2006.01)
*H10N 50/01* (2023.01)
*H10N 50/10* (2023.01)
*H10N 50/85* (2023.01)

(52) U.S. Cl.

CPC ........... *H10N 50/10* (2023.02); *G11C 11/161* (2013.01); *G11C 11/1675* (2013.01); *H10N 50/01* (2023.02); *H10N 50/85* (2023.02); *G11C 11/00* (2013.01)

(58) Field of Classification Search

CPC ...................................................... G11C 11/00
See application file for complete search history.

(56) References Cited

U.S. PATENT DOCUMENTS

2019/0206939 A1* 7/2019 Bozdag .................. G11C 11/00

* cited by examiner

*Primary Examiner* — Jason Lappas
(74) *Attorney, Agent, or Firm* — Ming Jiang; OPENPTO US LLC

(57) ABSTRACT

The present disclosure relates to a fixed layer of a magnetic tunnel junction, a magnetic storage chip, and a method for manufacturing the magnetic tunnel junction, and particularly provides a new MTJ device structure and a method for manufacturing the same. Specifically, fixed layers are prepared on both sides of a free layer of a conventional MTJ, i.e., forming a double-fixed-layer structure. The double-fixed-layer MTJ is made of ferromagnetic materials with high spin polarization rates that are subject to certain magnetization treatment, have a certain difference in coercivity strength and have opposite spin directions. The structure can realize for the first time that information writing energy can be reduced when spins of the fixed layers and the free layer of the MTJ change from parallel state to antiparallel state and from antiparallel state to parallel state.

3 Claims, 9 Drawing Sheets

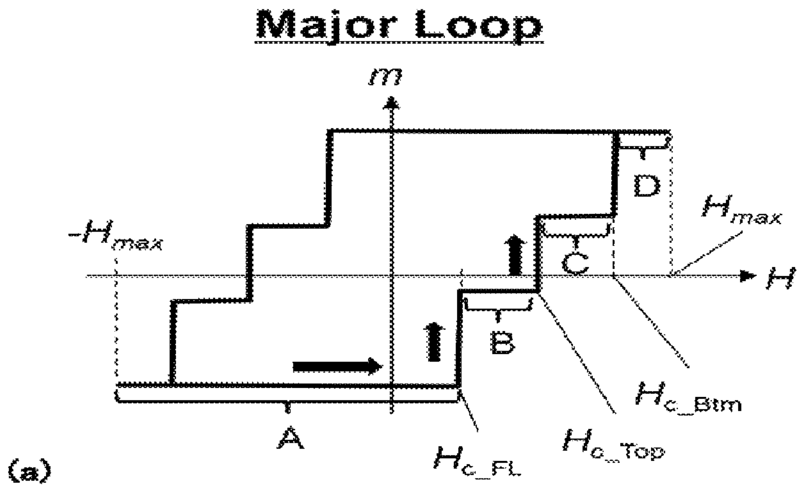
FIG. 8A
State of magnetization of each region
| Region: | A | B | C | D |
|---|---|---|---|---|
| Top Pin | ↓ | ↓ | ↑ | ↑ |
| FL | ↓ | ↑ | ↑ | ↑ |
| (b) Btm Pin | ↓ | ↓ | ↓ | ↑ |
FIG. 8B
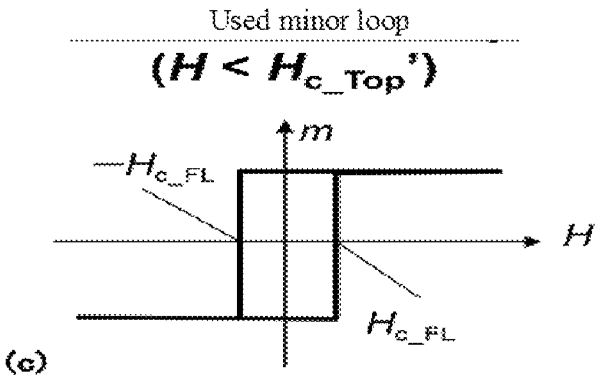
FIG. 8C

| Region: | A | B | C | D |
|---|---|---|---|---|
| Top Pin | ↓ | ↓ | ↑ | ↑ |
| FL | ↓ | ↑ | ↑ | ↑ |
| Btm Pin | ↓ | ↓ | ↓ | ↑ |

| Region: | C-1 | C-2 |
|---|---|---|
| Top Pin | ↑ | ↑ |
| FL | ↑ | ↓ |
| Btm Pin | ↓ | ↓ |

FIXED LAYER OF MAGNETIC TUNNEL JUNCTION, MAGNETIC MEMORY CHIP, AND METHOD FOR MANUFACTURING MAGNETIC TUNNEL JUNCTION

TECHNICAL FIELD

The present disclosure relates to the field of memory chips in integrated circuits, in particular to a fixed layer of a magnetic tunnel junction, an important device of a new generation of non-volatile memory, i.e., a magnetic memory, a magnetic memory chip formed by the magnetic tunnel junction, and a method for manufacturing the magnetic tunnel junction.

BACKGROUND ART

Random access memories (e.g., SRAMs and DRAMs) based on metal-oxide-semiconductor field-effect transistors (MOSFETs) have been decreasing in size in pursuit of high speed, low power consumption, and high integration. When MOSFETs are reduced to the nanometer size, the standby energy consumption (that is, volatility) of SRAMs and DRAMs caused by short channel effect becomes more and more serious. Magnetic random access memories (MRAMs) based on spintronic device magnetic tunnel junctions (MTJs) are the most promising memory chip for large-scale application in the new generation of integrated circuits because they do not require standby energy consumption (non-volatility) for information storage.

The MTJ forming the MRAM is formed by sandwiching a layer of ferromagnetic film with a fixed spin direction (called a fixed layer or pined layer) and a layer of ferromagnetic film with a spin direction that can be controlled to be flipped (called a free layer or reference layer) with an insulating tunneling layer (usually MgO). The spin directions of the two layers of magnetic films being antiparallel and parallel will form high and low resistance states through the MTJ for storing numerical information 0 and 1 (or 1 and 0) respectively. The information can be read by measuring the two resistances, while information writing may be carried out by changing the spin direction of the free layer.

Currently, the most likely large-scale application is to use of spin transfer torque (STT) for MTJ information writing. The principle is that spin electrons, as they travel from the fixed layer, pass through the insulating tunneling layer and enter the free layer or travel from the free layer, pass through the insulating tunneling layer and enter the fixed layer, may generate a magnetic moment that changes the spin direction of the free layer. Electrons have up and down spins, and because the number of the up spins is different from that of the down spins, a magnetic moment that reverses the direction of the free layer can be generated. That is, the greater the difference between the number of up spins and the number of down spins, the easier it is to reverse the magnetization direction of the free layer.

The difference between the up and down spins is determined by the electron spin polarization rate $\eta$ as shown in equation (1) below:

$$\eta=(s^{+}-s^{-})/(s^{+}+s^{-}) \quad (1)$$

where $s^{+}$ denotes the number of up spins, and $s^{-}$ denotes the number of down spins. When passing through the metallic ferromagnetic layers, free electrons become electrons of a conduction band of the ferromagnetic layers. For commonly used ferromagnets such as Fe, Co and Ni, the difference ($s^{+}>s^{-}$) between the numbers of $s^{+}$ and $s^{-}$ of conduction band electrons is responsible for producing ferromagnetic magnetization, and $\eta$ is not equal to zero and is a positive finite value.

Typically when the spin polarization rate of the ferromagnetic material for the fixed layer of the MTJ is high, an information writing current required when the state of the spin of the free layer and the fixed layer changes from antiparallel (AP) to parallel (P) may decrease, but an information writing current required when the state changes from P to AP may increase. The tunneling layer of the MTJ may be damaged by the voltage when the information writing current is too high, which is one of the important issues for MTJMRAMs with STT writing methods. The subject of the present disclosure is to reduce the information writing current of the MTJ when the state changes from P to AP and from AP to P.

SUMMARY OF THE INVENTION

In view of the background art and problems described above, the present disclosure provides a new magnetic tunnel junction (MTJ) device for a magnetic memory chip and a method for manufacturing the magnetic tunnel junction device. The magnetic tunnel junction device is provided with fixed layers on both sides of a free layer, i.e., being of a double-fixed-layer structure. The double fixed layers are made of ferromagnetic materials with high spin polarization rates that are subject to certain magnetization treatment, have a certain difference in coercivity strength and have opposite spin directions. Specifically, the present disclosure provides a magnetic tunnel junction for a magnetic memory chip. The magnetic tunnel junction includes: a free layer ferromagnetic film structure having a spin direction changing in an information storage process for information write, a first magnesium oxide film and a second magnesium oxide film disposed on both sides of the free layer ferromagnetic film structure, a first fixed layer ferromagnetic film structure disposed on the other side of the first magnesium oxide film and having a spin direction unchanged in the information storage process, and a second fixed layer ferromagnetic film structure disposed on the other side of the second magnesium oxide film and having a spin direction unchanged in the information storage process. Spin polarization rates of the first fixed layer ferromagnetic film structure and the second fixed layer ferromagnetic film structure are greater than 0.4; spins of the first fixed layer ferromagnetic film structure, the second fixed layer ferromagnetic film structure and the free layer ferromagnetic film structure are perpendicular to planes where the films are located; and coercivity of the first fixed layer ferromagnetic film structure is greater than that of the second fixed layer ferromagnetic film structure, and the coercivity of the second fixed layer ferromagnetic film structure is greater than that of the free layer ferromagnetic film structure.

In addition to the above, the film structure usually refers to a structure composed of one or more layers of films. The ferromagnetic film structure refers to that in one or more layers of films, ferromagnetism is the main component or the structure mainly exhibits ferromagnetic properties.

On the basis of the magnetic tunnel junction for the magnetic memory chip with the above structural characteristics, the structural characteristics thereof are further defined as: the first fixed layer ferromagnetic film structure and the second fixed layer ferromagnetic film structure are each a ferromagnetic film made of at least one of Co, Fe, Fe—Co alloy, Fe—Co—B alloy, Co—Mn—X (X=Si, Al) alloy, Co—Fe—X (X=Al, Si) alloy, Co—Cr—X (X=Al, Si) alloy, Co—Cr—Fe—Al alloy, Co—Mn—Al—Si alloy, Co—Mn—Fe—Si alloy, Co—Fe—Al—Si alloy, Co—Cr—V—Al alloy, or Co—V—Fe—Al alloy.

In addition to the above, the at least one ferromagnetic film means that there may be only one ferromagnetic film, or there may be a multilayer film composed of a ferromagnetic film and films made of other components (including ferromagnetic, anti-ferromagnetic or non-magnetic).

On the basis of the magnetic tunnel junction for the magnetic memory chip with the above structural characteristics, the structural characteristics thereof are further defined as: when the spin directions of the first fixed layer ferromagnetic film structure, the second fixed layer ferromagnetic film structure and the free layer ferromagnetic film structure are all parallel, a resistance is $R_A$; when the spin directions of the first fixed layer ferromagnetic film structure and the second fixed layer ferromagnetic film structure are parallel, and the spin directions of the second fixed layer ferromagnetic film structure and the free layer ferromagnetic film structure are antiparallel, a resistance is $R_B$; when the spin directions of the first fixed layer ferromagnetic film structure and the second fixed layer ferromagnetic film structure are antiparallel, and the spin directions of the second fixed layer ferromagnetic film structure and the free layer ferromagnetic film structure are parallel, a resistance is $R_C$; and when a result of $R_A$, $R_B$ and $R_C$ calculated by $(2R_C-R_B-R_A)/(R_A+R_B-R_C)$ is defined as a magnetoresistance (MR) ratio, an MR value is greater than 80%.

In addition to the above, the first fixed layer (or Bottom, Btm) is a fixed layer below the free layer, and the second fixed layer (or Top) is a fixed layer above of the free layer. When the spins of the first fixed layer and the free layer are parallel, the resistance of this portion is greater than that of the portion when the spins of the second fixed layer and the free layer are parallel. Moreover, the resistance difference of this portion between the parallel state and the antiparallel state of the spins of the first fixed layer and the free layer is greater than that of this portion between the parallel state and the antiparallel state of the spins of the second fixed layer and the free layer. Since there are two fixed layers, and each fixed layer and the free layer may have two resistive states, the device has four resistive states as a whole. The storage of information is achieved on the basis of the opposite spins of the first fixed layer and the second fixed layer and the difference between resistances generated before and after changing the spin direction of the free layer. The ratio of the difference between the resistances generated before and after changing the spin direction of the free layer to the resistance generated when the free layer is parallel to both the first fixed layer and the second fixed layer is defined as the magnetoresistance ratio of the entire double-fixed-layer storage device, i.e., the MR described above. The description of the above claim item is actually intended for calculation of the MR value. When the MR value is greater than 80%, a high resistance signal and a low resistance signal of the device may be clearly read.

For the storage device having all the above structural characteristics and the magnetic memory chip thereof, the manufacturing method therefor includes the following characteristic steps:

(1.1) preparing, on a base plate, a substrate necessary for a storage device, preparing the first fixed layer ferromagnetic film structure, the first magnesium oxide film, the free layer ferromagnetic film structure, the second magnesium oxide film and the second fixed layer ferromagnetic film structure successively from bottom to top, and then preparing a covering layer of the storage device;

(1.2) forming the device with specified patterns; and (1.3) after the device is completed, first applying a magnetic field that is perpendicular to a film surface of the device and greater than coercivity $H_{c\_Btm}$ of the first fixed layer ferromagnetic film structure, then gradually reducing the magnetic field to a zero magnetic field, increasing the magnetic field reversely to be greater than coercivity $H_{c\_Top}$ of the second fixed layer ferromagnetic film structure but smaller than the coercivity $H_{c\_Btm}$ of the first fixed layer ferromagnetic film structure, retaining for 1 minute, and removing the applied magnetic field.

In addition to the above, during preparation of an actual MRAM chip device, CMOS peripheral circuits (including circuits for reading, writing, address selection, power control, etc.) are first prepared on a silicon wafer, and then a film of the magnetic storage device is prepared on a certain metal layer at the back end of line (BEOL) of the above circuits. (1.1) describes the order of preparation of the films associated with the storage device having the structural characteristics of the present disclosure. (1.2) requires a process of two parts, i.e. photolithography and etching, each of which includes a large number of steps in the actual process, but can be designed through a general semiconductor process or referring to a general MTJ preparation process. (1.3) is an important characteristic step in the preparation process of the present disclosure, that is, the magnetization process described above needs to be added to the relevant steps in the preparation process in order to form the storage device having the characteristic structure and the chip thereof provided by the present disclosure.

The present disclosure has the effect that by means of the structure, the information writing current of the MTJ may be reduced at the same time when changing from P state to AP state and from AP state to P state. Because the higher the current (voltage), the more easily the MgO insulating tunneling layer is destroyed, the present disclosure can also significantly improve the durability of the insulating tunneling layer of the MTJ, so that the durability of the device is improved.

BRIEF DESCRIPTION OF THE DRAWINGS

FIGS. 2A-2B show one of the embodiments of the present disclosure, in which FIG. 2A is a schematic diagram of changes of a spin direction of a free layer of a double-fixed-layer magnetic tunnel junction (MTJ) device with opposite spintronic directions from up to down, and FIG. 2B is a schematic diagram of changes of a spin direction of a free layer of a double-fixed-layer magnetic tunnel junction (MTJ) device with opposite spintronic directions is from down to up.

FIGS. 3A-3D are one of the embodiments of the present disclosure, in which FIG. 3A shows a basic structure of a commonly used single-fixed-layer magnetic tunnel junction (MTJ) device and the conversion of the spin directions of the free layer and the fixed layer from antiparallel (AP) state to parallel (P) state, FIG. 3B shows a relationship between an information writing current ($I_w$) and pulse time $t_{sw}$ required for reversal thereof when using materials of different spin polarization rates (η) and the conversion of the spin directions of the free layer and the fixed layer from AP state to P state, FIG. 3C shows a basic structure of a commonly used single-fixed-layer magnetic tunnel junction (MTJ) device and the conversion of the spin directions of the free layer and the fixed layer from P state to AP state, and FIG. 3D shows a relationship between an information writing current ($I_w$) and pulse time $t_{sw}$ required for reversal thereof when using materials of different spin polarization rates (η) and the conversion of the spin directions of the free layer and the fixed layer from P state to AP state.

FIGS. 4A-4B are one of the embodiments of the present disclosure, in which FIG. 4A shows a schematic diagram illustrating the principle of information writing in a manner of a spin transfer torque at a single-fixed-layer MTJ from AP state to P state and FIG. 4B shows a schematic diagram illustrating the principle of information writing in manner of a spin transfer torque at a single-fixed-layer MTJ from P state to AP state.

FIGS. 5A-5B are one of the embodiments of the present disclosure, in which FIG. 5A shows a relationship between an information writing current ($I_w$) when using materials with different spin polarization rates (η) and pulse time $t_{sw}$ required for reversal thereof when a spin of a free layer of a double-fixed-layer MTJ provided by the present disclosure changes during an up to down process of the spin of the free layer, and FIG. 5B shows a relationship between an information writing current ($I_w$) when using materials with different spin polarization rates (η) and pulse time $t_{tsw}$ required for reversl there of when a spin of a free layer of a double-fixed-layer MTJ provided by the present disclosure changes during a down to up process of the spin of the free layer.

FIGS. 6A-6B are one of the embodiments of the present disclosure, in which FIG. 6A shows a reversal mechanism for a spin of a free layer of a double-fixed-layer MTJ provided by the present disclosure, during an up to down process of the spin of the free layer, FIG. 6B shows a reversal mechanism for a spin of a free layer of a double-fixed-layer MTJ provided by the present disclosure during a down to up process of the spin of the free layer.

FIGS. 8A-8C are one of the embodiments of the present disclosure, where FIG. 8A shows an overall hysteresis loop (called major loop) of a double-fixed-layer MTJ provided by the present disclosure under a wide range of scanning of an applied magnetic field, FIG. 8B shows magnetization directions (also called spin directions) of a first fixed layer, a free layer, and a second fixed layer in each region of the hysteresis loop in FIG. 8A, and FIG. 8C shows a local magnetization curve (called minor loop) of a double-fixed-layer MTJ provided by the present disclosure under scanning of an applied magnetic field less than coercivity of a second fixed layer (top pin).

FIG. 9A shows a variation diagram (major loop) of a magnetoresistance value of a double-fixed-layer magnetic tunnel junction provided by the present disclosure under a wide range of magnetic field scanning, and a variation diagram (minor loop) of a magnetoresistance value under scanning of an applied magnetic field less than coercivity of a second fixed layer (top pin); and FIG. 9B shows magnetization directions of a first fixed layer, a free layer and the second fixed layer in each region in (a).

DETAILED DESCRIPTION OF THE INVENTION

The present disclosure is described below in conjunction with the accompanying drawings and by way of example of implementations.

Embodiment 1

Figure 1:
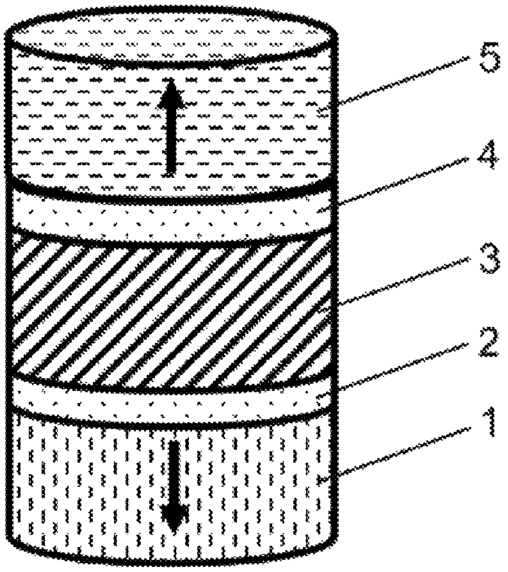
FIG. 1 is one of the embodiments of the present disclosure, and shows a basic structure of a double-fixed-layer magnetic tunnel junction (MTJ) device with opposite spintronic directions according to the present disclosure.
Figure 2A:
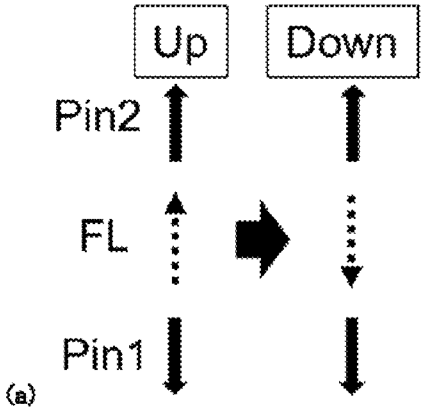
Figure 2B:
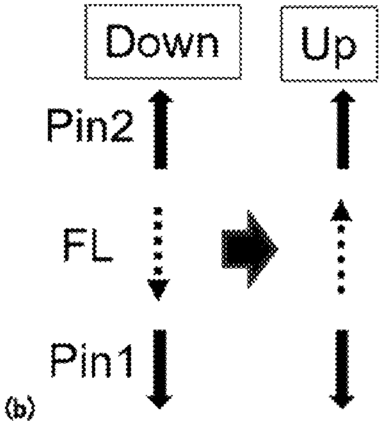

FIG. 1 is one of the embodiments of the present disclosure, and shows a basic structure of a double-fixed-layer magnetic tunnel junction (MTJ) device with opposite spintronic directions according to the present disclosure, where 1 denotes a first fixed layer film structure, referred to as a first fixed layer, also known as Pin 1, bottom fixed layer, Bottom Pin, Btm Pin, etc., and Btm or Pin 1 being usually used in the specification and the figures, 2 denotes a first magnesium oxide (MgO) film, 3 denotes a free layer film structure, referred to as a free layer, also known as FL, 4 denotes a second magnesium oxide film, and 5 denotes a second fixed layer film structure, referred to as a second fixed layer, also known as Pin 2, a top fixed layer, Top Pin, etc., Top or Pin 2 being generally used in the specification and the figures. In the actual process, the magnesium oxide films 2 and 4 may be film structures with magnesium oxide as the main component and play a tunneling role. FIGS. 2A-2B are a schematic diagram of a spin direction of a free layer of a double-fixed-layer magnetic tunnel junction (MTJ) device with opposite spintronic directions from up to down, and from down to up, respectively. Where Up and Down denote an up spin direction and a down spin direction of the free layer (FL), respectively.

Embodiment 2

Figure 3A:
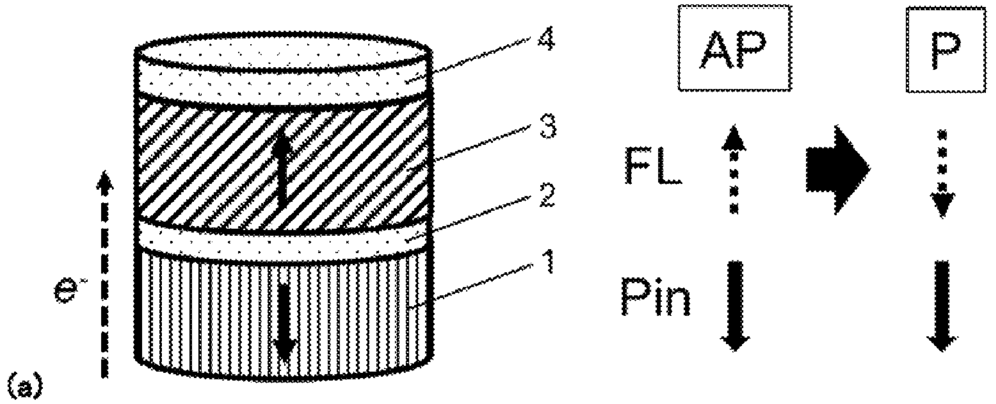
Figure 3B:
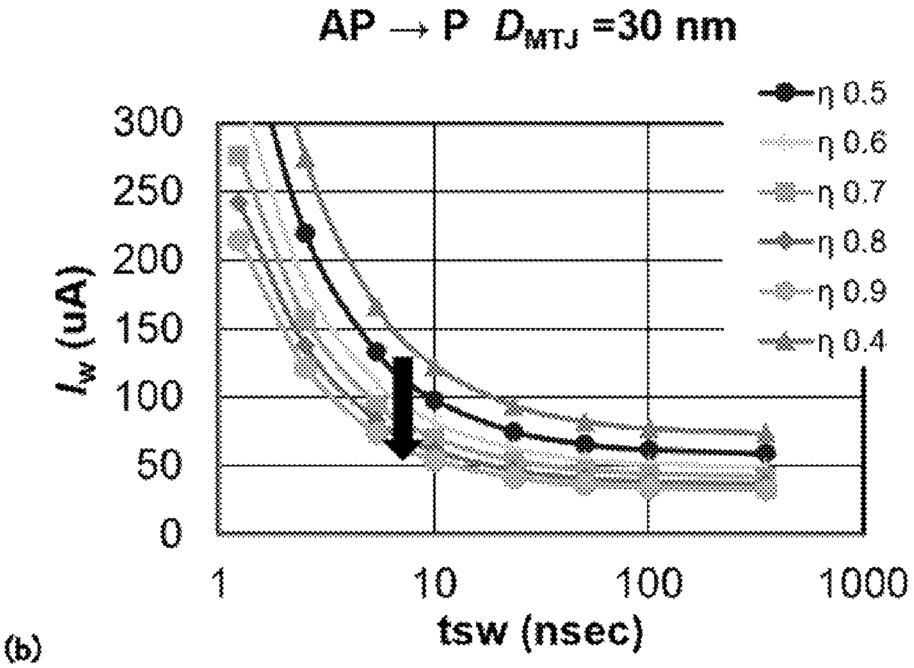
Figure 3C:
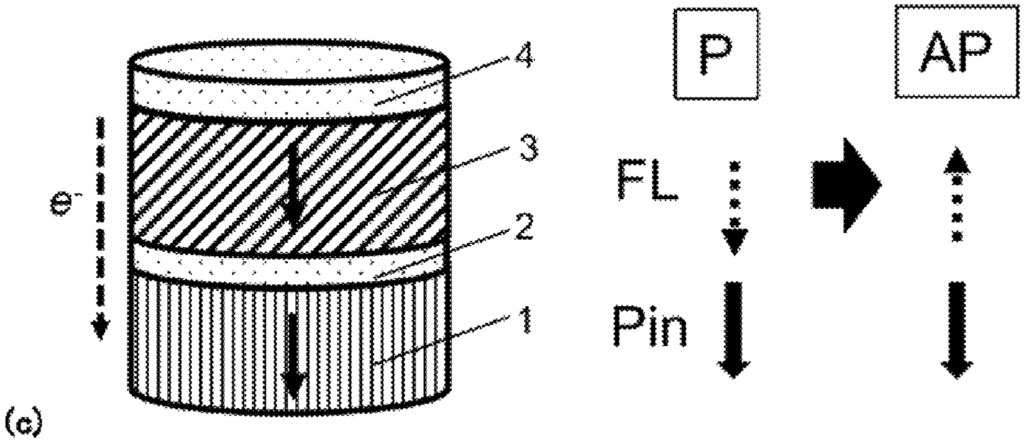
Figure 3D:
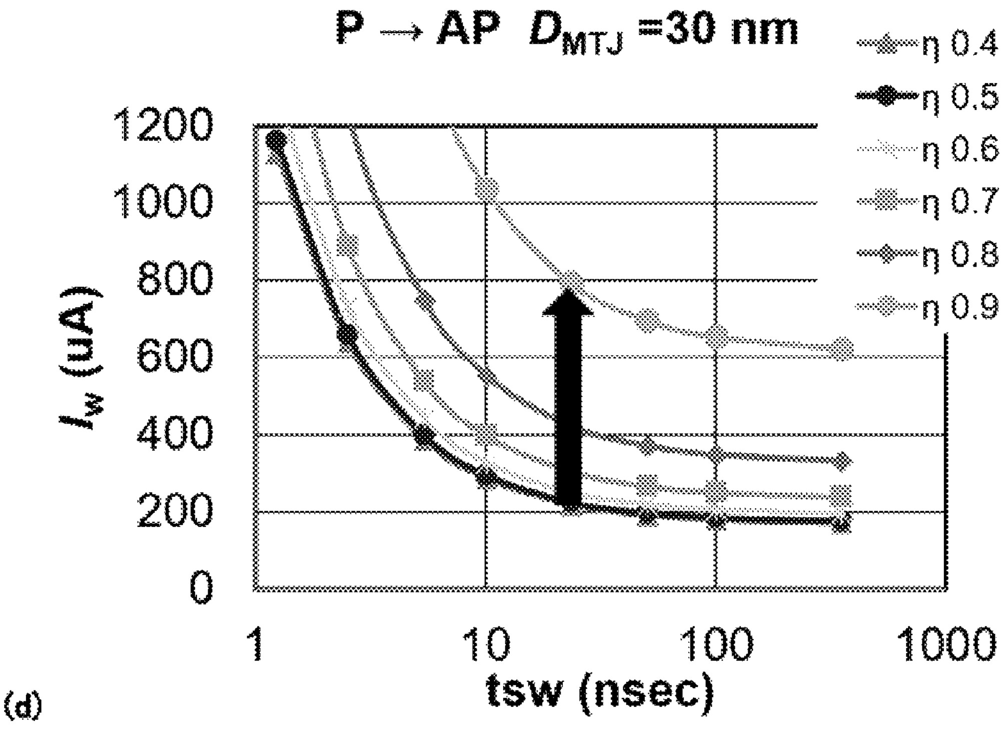

FIGS. 3A-3D are one of the embodiments of the present disclosure, and show a basic structure of a commonly used single-fixed-layer magnetic tunnel junction (MTJ) device. A fixed layer of the device is typically at the bottom, i.e., between a free layer and a base plate. In FIG. 3A and FIG. 3C, 1 denotes the fixed layer, 2 denotes an MgO tunneling layer, 3 denotes the free layer, 4 denotes an MgO layer used to improve the thermal stability, and the right side shows a schematic diagram of a change of spin directions. In FIG. 3A, the spin directions of the free layer and the fixed layer are antiparallel (AP), and the right side shows a schematic diagram of the conversion of the spin directions of the free layer and the fixed layer from antiparallel (AP) to parallel (P). FIG. 3B corresponds to experimental simulation results of information writing current ($I_w$) and pulse time $t_{sw}$ required for reversal thereof in the above process from AP to P when the MTJ has a diameter of 30 nm and materials with different spin polarization rates (η) are used. It can be seen that the required information writing current decreases when η increases from 0.4 to 0.9. In FIG. 3C, the spin directions of the free layer and the fixed layer are parallel (P), and the right side shows a schematic diagram of the conversion of the spin directions of the free layer and the fixed layer from parallel (P) to antiparallel (AP). FIG. 3D corresponds to experimental simulation results of information writing current ($I_w$) and pulse time $t_{sw}$ required for reversal thereof in the above process from P to AP when the MTJ has a diameter of 30 nm and materials with different spin polarization rates (η) are used. It can be seen that the required information writing current increases when η increases from 0.4 to 0.9. In terms of specific numbers, when the resolution η changes from 0.4 to 0.9, the writing current is halved during (a), i.e. from AP to P, but the writing current is increased by 5 times during (b), i.e. from P to AP. This is a major problem with the commonly used single-fixed-layer MTJ. In the common MTJ device, by increasing the spin polarization rate of a ferromagnetic layer, a writing current in one direction may be decreased, but at the same time, a writing current in the other direction may be increased. A high writing current may cause the MgO tunneling layer prone to being destroyed and reduce the performance of the MTJ and the memory chip thereof.

Figure 4A:
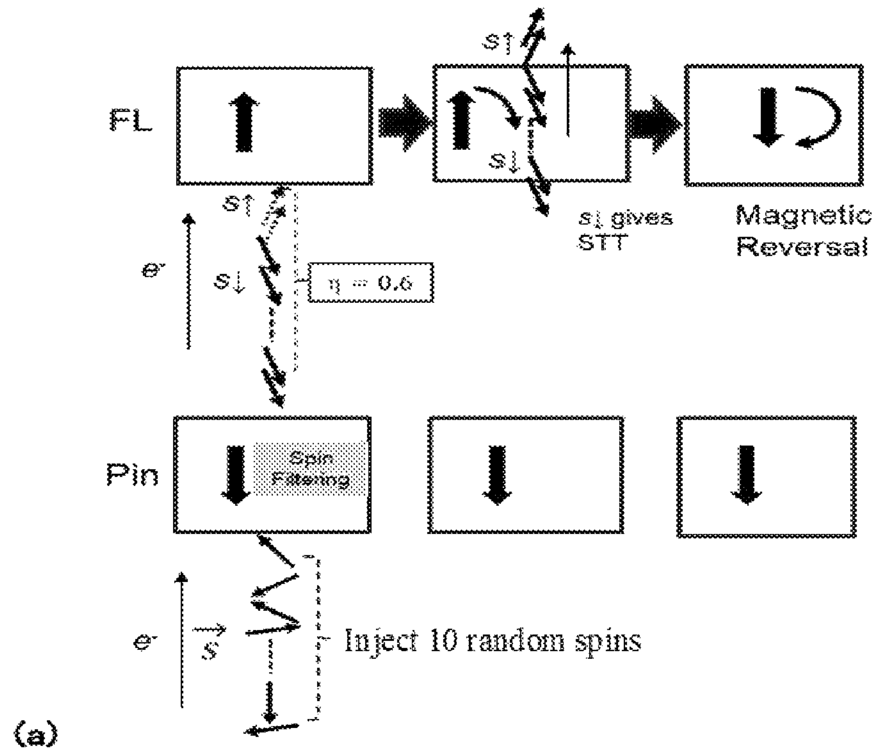
Figure 4B:
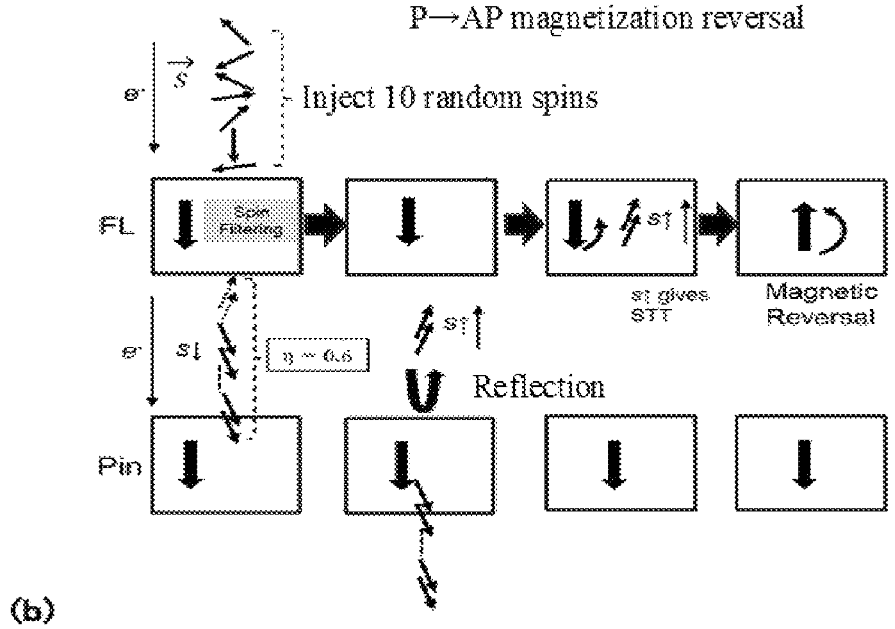

FIGS. 4A-4B are one of the embodiments of the present disclosure, and show a schematic diagram illustrating the principle of information writing in a manner of a spin transfer torque at a single-fixed-layer MTJ. FIG. 4A shows the principle of magnetic reversal from AP to P of the spin directions of the free layer and the fixed layer. In this case, assuming that 10 electrons (which may be regarded as random spins) flow from the fixed layer to the free layer, these electrons may be subject to spin polarization in the fixed layer, and because the spin polarization rate is 0.6, the spins are roughly divided into eight down spins and two up spins; and after these spins arrive at the free layer, spin electrons the same as the spin of the free layer may be transported outward through the free layer, while the spins opposite the free layer may accumulate in the free layer, and after accumulating for a certain amount, a magnetic moment (i.e. STT) that makes the spin in the free layer reverse may be produced. FIG. 4B shows the principle of magnetic reversal from P to AP of the spin directions of the free layer and the fixed layer. In this case, assuming that 10 electrons (which may be regarded as random spins) flow from the free layer to the fixed layer, these electrons may be subject to spin polarization in the free layer, and because the spin polarization rate is 0.6, as defined by the spin polarization rate, roughly eight down spins and two up spins may be formed; and after these spins arrive at the fixed layer, spin electrons the same as the spin of the fixed layer may be transported outward through the fixed layer, while the spins opposite the fixed layer may return to the free layer and accumulate, and after accumulating for a certain amount, a magnetic moment that makes the spin in the free layer reverse may be produced. It can be seen that by using the same writing current, the generated magnetic moment from AP to P is four times larger than that from P to AP, which is close to the experimental simulation results in FIG. 3B and FIG. 3D.

Embodiment 3

Figure 5A:
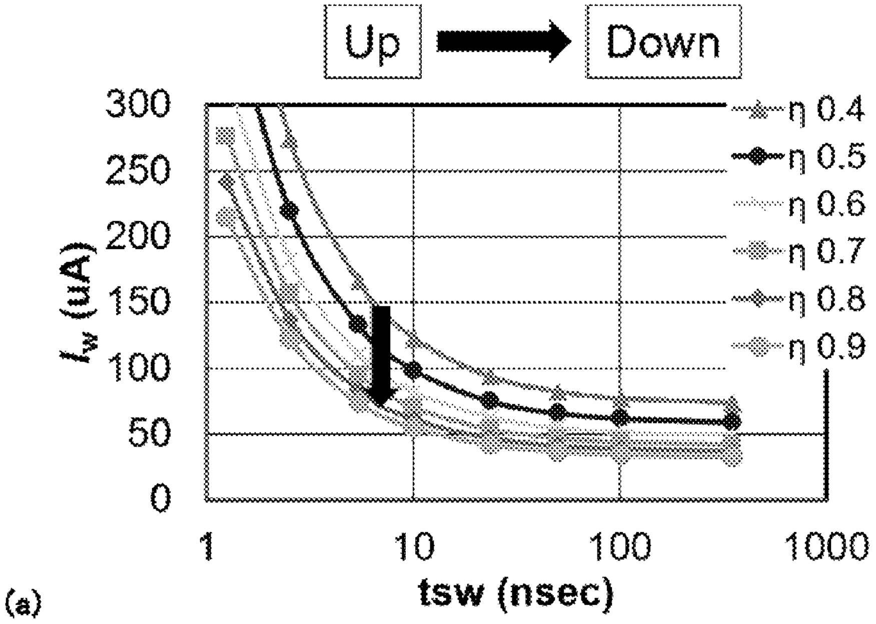
Figure 5B:
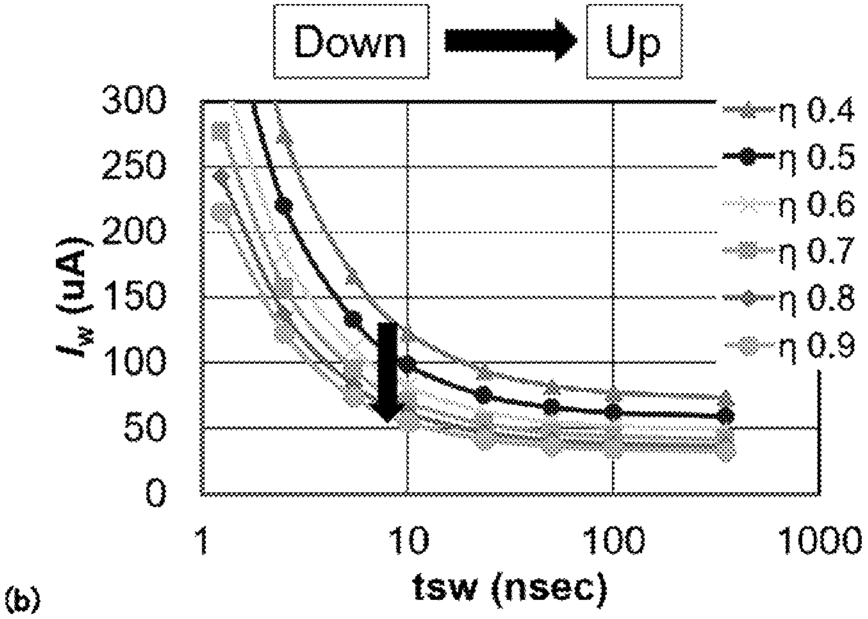

FIGS. 5A-5B are one of the embodiments of the present disclosure, where FIG. 5A corresponds to experimental simulation results of an information writing current ($I_w$) and pulse time $t_{sw}$ required for reversal thereof during the conversion from up to down of the spin of the free layer of the double-fixed-layer MTJ provided by the present disclosure in FIG. 2A, using materials with different spin polarization rates (η). The diameter of the MTJ is 30 nm, and it can be seen that the required information writing current is halved when η increases from 0.4 to 0.9. FIG. 5B corresponds to experimental simulation results of an information writing current ($I_w$) and pulse time $t_{sw}$ required for reversal thereof during the conversion from down to up of the spin of the free layer of the double-fixed-layer MTJ provided by the present disclosure in FIG. 2B, using materials with different spin polarization rates (η). The diameter of the MTJ is 30 nm, and it can be seen that the required information writing current is also halved as η increases from 0.4 to 0.9.

Figure 6A:
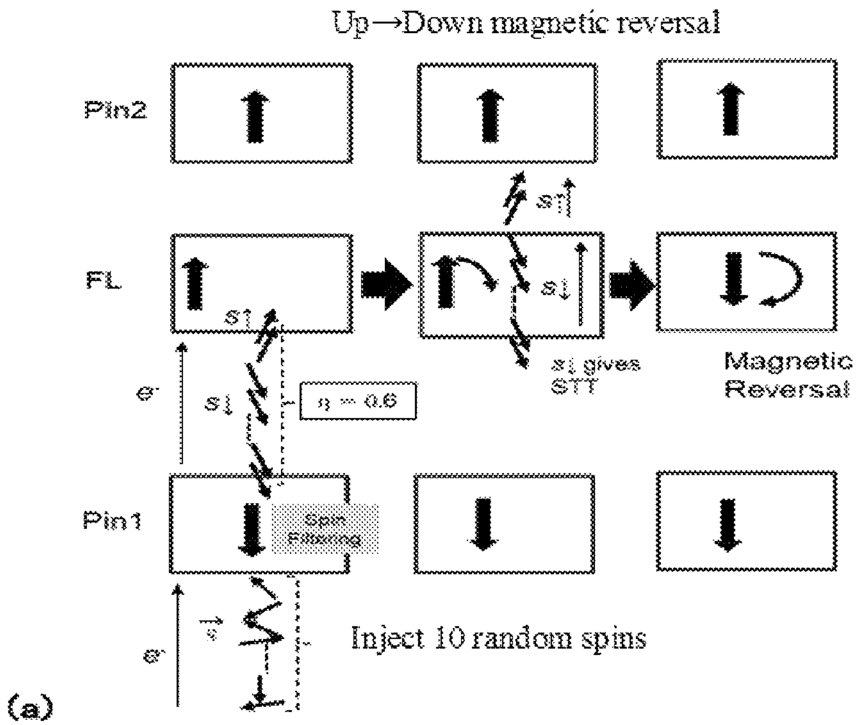
Figure 6B:
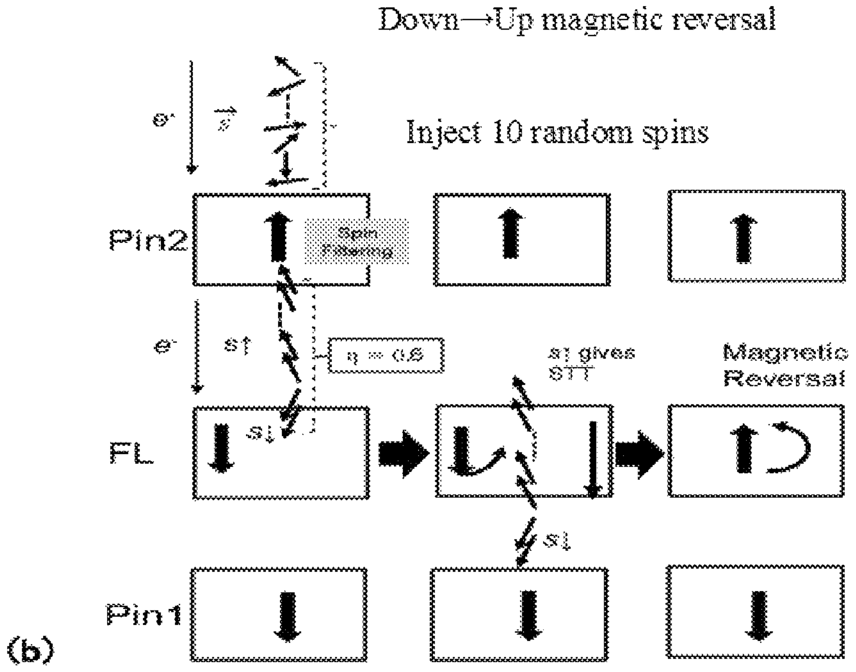

FIGS. 6A-6B are one of the embodiments of the present disclosure, and show a reversal mechanism for a spin of a free layer of a double-fixed-layer MTJ provided by the present disclosure. When the spin of the free layer of the double-fixed-layer MTJ described in FIG. 6A is up, 10 random electrons are injected from the first fixed layer (Pin 1), and after the injected electrons pass through the fixed layer for spin polarization, because the spin polarization rate is 0.6, as defined by the spin polarization rate, roughly eight down pins and two up spins may be formed. When these spins pass through the free layer, the spins in the same up direction as the free layer may pass through the free layer and then flow out through the second fixed layer (Pin 2) of which the spin is also up. The spins opposite the free layer in direction (i.e., down spins) may accumulate in the free layer to form a magnetic moment (i.e., STT), which may change the direction of magnetization of the free layer after accumulating for a certain amount. When the spin of the free layer of the double-fixed-layer MTJ described in FIG. 6B is down, 10 random electrons are injected from the second fixed layer (Pin 2), and after the injected electrons pass through the fixed layer for spin polarization, because the spin polarization rate is 0.6, as defined by the spin polarization rate, roughly eight up spins and two down spins may be formed. When these spins pass through the free layer, the spins in the same down direction as the free layer may pass through the free layer and then flow out through the first fixed layer (Pin 1) of which the spin is also down. The spins opposite the free layer in direction (i.e., up spins) may accumulate in the free layer to form a magnetic moment (i.e., STT), which may change the direction of magnetization of the free layer after accumulating for a certain amount.

As shown in FIGS. 1 and 2, when two fixed layers are provided on two sides of the free layer, the magnetization directions of the two fixed layers must be opposite. In order to cause the magnetization directions of the two fixed layers to be opposite, the magnetic anisotropy of the two fixed layers and the free layer, i.e. a total of three ferromagnetic materials, must be different. The effective magnetic anisotropy energy constants per unit volume of the second fixed layer (Btm Pin, Pin 2), the free layer (FL), and the first fixed layer (Top Pin, Pin 1) from top to bottom are defined as $K_{eff\_Top}$, $K_{eff\_FL}$ and $K_{eff\_Btm}$, respectively. When the device is a column with an assumed diameter D of 30 nm, the magnetic anisotropy energy constants of the above three layers need to satisfy the relationship of Eq. (2), that is, $$K_{eff\_FL} < K_{eff\_Top} < K_{eff\_Btm} \qquad (2)$$

When the diameter is 30 nm, the structure of magnetic domains may be seen, and accordingly the following relational expressions (collectively Eq. (3)) apply:

$$K_{eff\_FL} = (1/2)M_{\_FL}H_{c\_FL}, \quad (3)$$
$$K_{eff\_Top} = (1/2)M_{Top}H_{c\_Top},$$
$$K_{eff\_Btm} = (1/2)M_{Btm}H_{c\_Btm}$$

Based on the relation of Eq. (2), the coercivity of columns with the diameter of 30 nm of the second fixed layer, the free layer, and the first fixed layer described above satisfy the following equation (Eq. (4)):

$$H_{c\_FL} < H_{c\_Top} < H_{c\_Btm} \quad (4)$$

Figure 7:
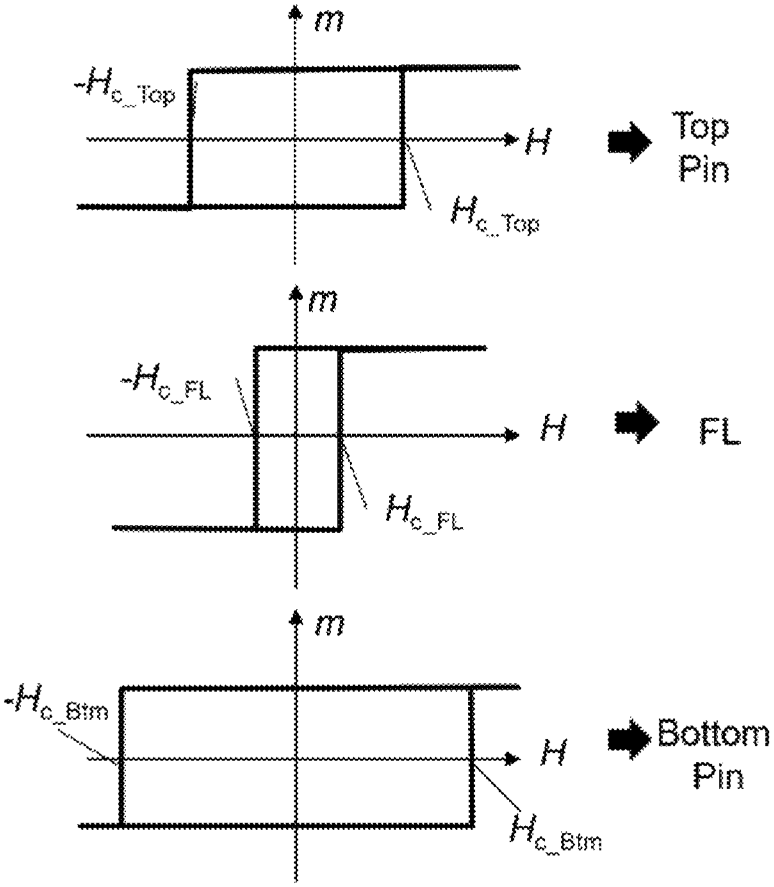
FIG. 7 is one of the embodiments of the present disclosure, and shows, from top to bottom, independent magnetized loops of ferromagnet film structures of a first fixed layer, a free layer and a second fixed layer in a double-fixed-layer MTJ provided by the present disclosure.

FIG. 7 is a schematic diagram of a hysteresis loop of a cylindrical MTJ superposed structural body (Btm Pin/MgO1/FL/MgO2/Top Pin) with a diameter of 30 nm prepared based on the above three layers. When the external magnetic field changes from negative to positive, magnetic reversal of the free layer is first seen when $H=H_{c\_FL}$; when $H=H_{c\_Top}$, the magnetization of the second fixed layer at the top is reversed; and when the magnetic field continues to change to $H=H_{c\_Btm}$, the magnetization of the first fixed layer at the bottom is reversed.

From the smallest magnetic field ($-H_{max}$) to the greatest magnetic field ($+H_{max}$), the hysteresis loop is divided into the following regions:

Region $A$: $-H_{max} < H < H_{c\_FL}$

Region $B$: $H_{c\_FL} < H < H_{c\_Top}$

Region $C$: $H_{c\_Top} < H < H_{c\_Btm}$

Region $D$: $H_{c\_Btm} < H < H_{max}$

FIG. 8A shows, from region A to region D, the state of the magnetization direction of the above superposed structural body of the MTJ with the diameter of 30 nm. In region A, the magnetization directions of all the three ferromagnetic layers (the second fixed layer, the free layer, and the first fixed layer) are down. In region B, the magnetization direction of the free layer is up, and the magnetization direction of the two fixed layers is down. In region C, the magnetization direction of the second fixed layer at the top is also reversed to be up. In region D, the magnetization directions of all the three ferromagnetic layers (the second fixed layer, the free layer, and the first fixed layer) are up. To make the magnetization directions of the two fixed layers opposite, the magnetization process is as follows: the external magnetic field H firsts becomes $-H_{max}$, is then slowly increased to region C ($H_{c\_Top}<H<H_{c\_Btm}$), and is retained for a period of time, so that the external magnetic field H becomes 0. FIG. 8B shows the state of magnetization of each ferromagnetic layer in each region during the above magnetization process. The magnetization directions of the second fixed layer at the top and the free layer are up, while the magnetization direction of the first fixed layer at the bottom is down. In this state, FIG. 8C shows a local hysteresis loop measured by an applied magnetic field when the up-down direction of the free layer changes during use of the device provided by the present disclosure, the coercivity being $H_{c\_FL}$.

Figure 9A:
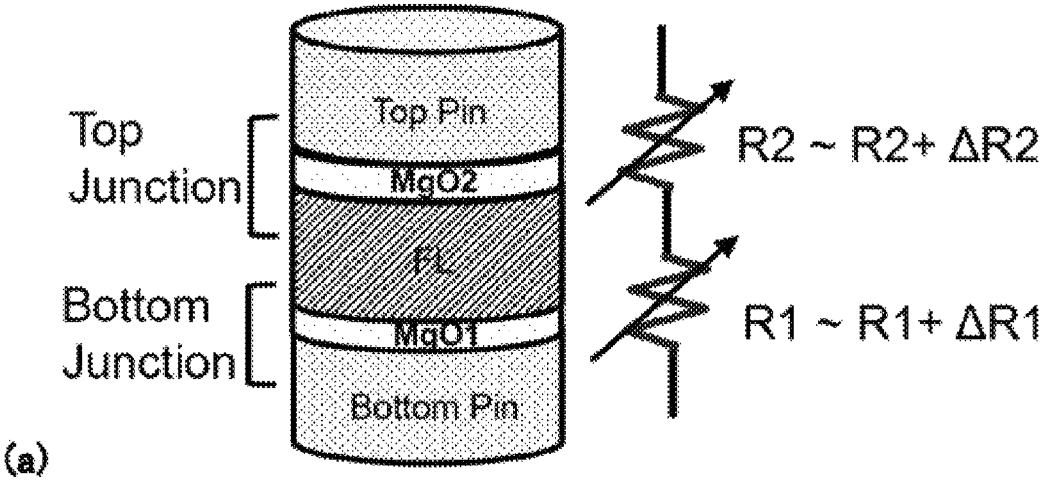
FIGS. 9A-9B are one of the embodiments of the present disclosure, where

FIG. 9A is a schematic structural diagram of the double-fixed-layer MTJ provided by the present disclosure, where the top fixed layer (the second fixed layer) and the free layer may be regarded as a top magnetic tunnel junction, and the bottom fixed layer (the first fixed layer) and the free layer may be regarded as a bottom magnetic tunnel junction. The low-resistance states of the magnetoresistance thereof are R2 (the second fixed layer) and R1 (the first fixed layer), and resistance differences of the low-resistance state and the high-resistance state are ΔR1 and ΔR2, respectively. The magnetoresistance values of the bottom and top tunnel junctions are defined as MR1 and MR, respectively, and the ratio of R2 to R1 is defined as α, so $$MR1 = \Delta R1/R1,\ MR2 = \Delta R2/R2 \quad (5)$$
$$\alpha = R2/R1$$

Figure 9B:
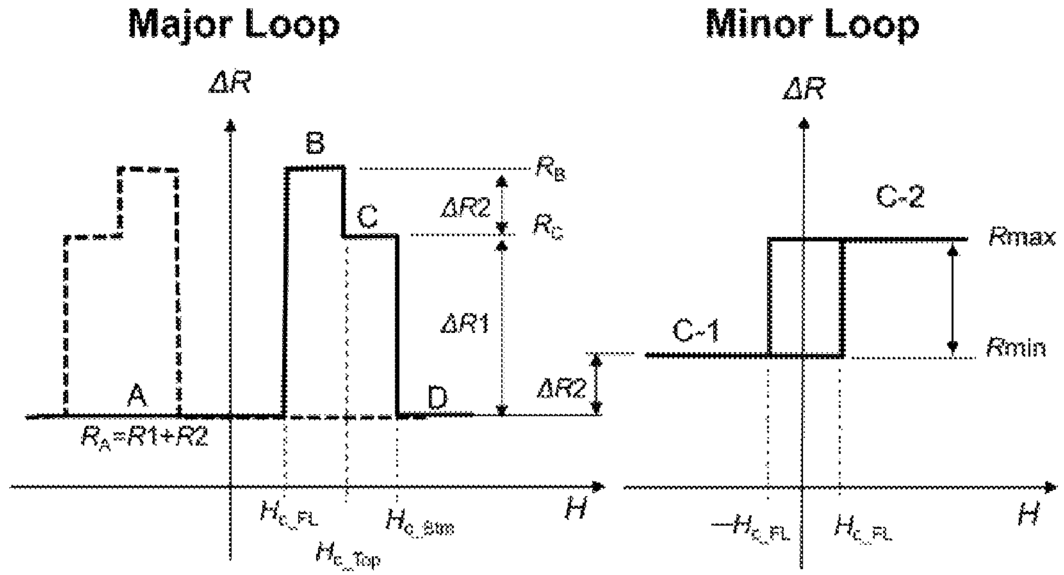

FIG. 9B shows a variation diagram (major loop) of a magnetoresistance value of the double-fixed-layer magnetic tunnel junction provided by the present disclosure under a wide range of magnetic field scanning, and a magnetization curve, i.e. minor loop, under scanning of an external magnetic field less than the coercivity of the second fixed layer (top pin). The diagrams below the two magnetization curves are schematic diagrams of the magnetization directions (also known as spin directions) of the first fixed layer, the free layer and the second fixed layer within the magnetic field region. In the wide-area hysteresis loop (on the left of FIG. 9B) under the wide range of scanning by the applied magnetic field, region A and region D have the lowest resistance $R_A$, region B has the resistance $R_B$, and region C has the resistance $R_C$. There are the following relationships:

$$R_A = R1 + R2 \quad (6)$$
$$R_B = R0 + \Delta R1 + \Delta R2$$
$$R_C = R1 + R2 + \Delta R1$$

In the wide range of scanning by the external magnetic field, the external magnetic field is changed to 0 in region C, FIG. 9B shows a graph of a local hysteresis loop measured under an external field smaller than $H_{c\_Top}$, and a single hysteresis loop is produced when the external field is $+H_{c\_FL}$ and $-H_{c\_FL}$. This hysteresis loop may be used to store 0 and 1.

The minimum resistance of the local hysteresis loop is set to $R_{min}$ and the maximum resistance is $R_{max}$. Accordingly, $R_{min}$ and $R_{max}$ have the following relationship:

$$R_{max} = R_C = R1 + R2 + \Delta R1 \quad (7)$$
$$R_{min} = R_A + \Delta R2 = R1 + R2 + \Delta R2$$

Further, the magnetoresistance (MR) ratio of the double-fixed-layer MTJ device may be calculated as follows:

$$MR = (\Delta R1 - \Delta R2)/(R1 + R2 + \Delta R2) \quad (8)$$

Here, assuming that the magnetoresistance ratios of the bottom and top tunnel junctions of Eq. (5) are both 150% ($\Delta R1/R1=\Delta R2/R2=1.5$), the MR of the entire superposed MTJ film structural body device is:

$$MR = 1.5(1-\alpha)/(1+2.5\alpha) \quad (9)$$

When the ratio $\alpha$ of R2 to R1 is 1/5, the MR value is 0.8 (the MR ratio is 80%), the MR is 1.08 (the MR ratio is 108%) when $\alpha$ is 1/10, and the MR is 1.33 (the MR ratio is 133%) when $\alpha$ is 1/20. From the point of view of signal reading, it is desirable that the MR is greater than 80% and the minimum resistance R2 of the top tunnel junction is lower than 1/5 of the minimum resistance of the bottom tunnel junction. A more desirable condition is that the MR is greater than 100% and the minimum resistance R2 of the top tunnel junction is lower than 1/10 of the minimum resistance of the bottom tunnel junction.

According to the device provided by the present disclosure, after the films grow according to the structure of FIG. 1 and the MTJ device is formed according to a common semiconductor process, a magnetic field that is perpendicular to the film surface of the device and greater than the coercivity $H_{c\_Btm}$ of the first fixed layer ferromagnetic film structure is applied first, the magnetic field is gradually reduced to a zero magnetic field, then reversely increased to be greater than the coercivity $H_{c\_Top}$ of the second fixed layer ferromagnetic film structure but smaller than the coercivity $H_{c\_Btm}$ of the first fixed layer ferromagnetic film structure, and retained for 1 minute, and the applied magnetic field is removed. In this case, it can be ensured that the spin directions of the two fixed layers are opposite, and then the spin direction of the free layer is changed within the range of the current or magnetic field which is smaller than that changing the spin direction of the second fixed layer, so as to perform reading, writing and storing of information. That is, the preparation of the double-fixed-layer MTJ device of the present disclosure is completed.

All the above embodiments only express certain implementations of the present disclosure, are described in a specific manner, but are not to be construed as a limitation of the scope of the patent of invention. It should be pointed out that, for a person of ordinary skill in the art, several deformations and improvements can be made without departing from the conception of the present disclosure, all of which fall within the scope of protection of the present disclosure. Therefore, the scope of protection of the patent of invention shall be subject to the appended claims.

The invention claimed is:

1. A magnetic tunnel junction for a magnetic memory chip, comprising: a free layer ferromagnetic film structure having a spin direction changing in an information storage process for information write, a first magnesium oxide film and a second magnesium oxide film disposed on both sides of the free layer ferromagnetic film structure, a first fixed layer ferromagnetic film structure disposed on the other side of the first magnesium oxide film and having a spin direction unchanged in the information storage process, and a second fixed layer ferromagnetic film structure disposed on the other side of the second magnesium oxide film and having a spin direction unchanged in the information storage process, wherein spin polarization rates of the first fixed layer ferromagnetic film structure and the second fixed layer ferromagnetic film structure are greater than 0.4; spins of the first fixed layer ferromagnetic film structure, the second fixed layer ferromagnetic film structure and the free layer ferromagnetic film structure are perpendicular to planes where the films are located; and coercivity of the first fixed layer ferromagnetic film structure is greater than that of the second fixed layer ferromagnetic film structure, and the coercivity of the second fixed layer ferromagnetic film structure is greater than that of the free layer ferromagnetic film structure.

2. The magnetic tunnel junction for a magnetic memory chip according to claim 1, wherein the first fixed layer ferromagnetic film structure and the second fixed layer ferromagnetic film structure are each a ferromagnetic film made of at least one of Co, Fe, Fe—Co alloy, Fe—Co—B alloy, Co—Mn—X (X═Si, Al) alloy, Co—Fe—X (X═Al, Si) alloy, Co—Cr—X (X═Al, Si) alloy, Co—Cr—Fe—Al alloy, Co—Mn—Al—Si alloy, Co—Mn—Fe—Si alloy, Co—Fe—Al—Si alloy, Co—Cr—V—Al alloy, or Co—V—Fe—Al alloy.

3. The magnetic tunnel junction for a magnetic memory chip according to claim 2, wherein when the spin directions of the first fixed layer ferromagnetic film structure, the second fixed layer ferromagnetic film structure and the free layer ferromagnetic film structure are all parallel, a resistance is $R_A$; when the spin directions of the first fixed layer ferromagnetic film structure and the second fixed layer ferromagnetic film structure are parallel, and the spin directions of the second fixed layer ferromagnetic film structure and the free layer ferromagnetic film structure are antiparallel, a resistance is $R_B$; when the spin directions of the first fixed layer ferromagnetic film structure and the second fixed layer ferromagnetic film structure are antiparallel, and the spin directions of the second fixed layer ferromagnetic film structure and the free layer ferromagnetic film structure are parallel, a resistance is $R_C$; and when a result of $R_A$, $R_B$ and $R_C$ calculated by $(2R_C-R_B-R_A)/(R_A+R_B-R_C)$ is defined as a magnetoresistance (MR) ratio, an MR value is greater than 80%.

* * * * *